United States Patent [19]

Tomoyori

[11] Patent Number: 4,779,103
[45] Date of Patent: Oct. 18, 1988

[54] THERMAL HEAD AND METHOD OF MANUFACTURING THE SAME

[75] Inventor: Makoto Tomoyori, Iwate, Japan

[73] Assignee: Alps Electric Co., Ltd., Japan

[21] Appl. No.: 760,298

[22] Filed: Jul. 29, 1985

[30] Foreign Application Priority Data

Jul. 28, 1984 [JP] Japan .................................. 59-158289

[51] Int. Cl.$^4$ ............................................. G01D 15/10
[52] U.S. Cl. .................................. 346/76 PH; 219/543
[58] Field of Search ............. 346/76 PH, 76 R, 159 C; 252/518, 519; 219/216 PH, 543; 338/308; 400/120; 428/935; 250/317.1, 318

[56] References Cited

U.S. PATENT DOCUMENTS 3,825,722 7/1974 Taniguchi ............................ 214/543
4,236,163 11/1980 Iino ..................................... 346/76 R
4,259,564 3/1981 Ohkubo et al. ................ 346/76 PH Primary Examiner—Arthur G. Evans
Attorney, Agent, or Firm—Guy W. Shoup

[57] ABSTRACT

Disclosed is a thermal head in which an oxidation proof layer and an abrasion resisting layer are formed on a heating resistor layer and an electric conductor layer, the abrasion resisting layer being a metal layer in which abrasion resisting particles are mixed and dispersed and being partially formed about a heating portion. A method of manufacturing the thermal head of the kind as described above in which the abrasion resisting layer is formed by applying non-electrolytic plating at the portion about the heating portion on the oxidation proof layer with a mother metal material into which abrasion resisting particles are mixed and dispersed.

2 Claims, 4 Drawing Sheets

THERMAL HEAD AND METHOD OF MANUFACTURING THE SAME

BACKGROUND OF THE INVENTION

1. Field of the Invention

The present invention relates to a thermal head and a method of manufacturing the same, in which an oxidation-proof layer and an abrasion resisting layer are formed on a heating resistor layer and an electric conductor layer.

2. Description of the Prior Art

Conventionally, a thermal head of the kind as described above is arranged, for example, as shown in FIG. 4. That is, a glaze layer 12 is formed on the surface of an insulating substrate 11 such as alumina, and a heating resistor layer 13 made of $Ta_2N$, or the like, is formed on the glaze layer 12. A power feeding conductor layer 14 of a predetermined pattern is formed on the heating resistor layer 13. An oxidation proof layer 15 made of $SiO_2$, or the like, and an abrasion resisting layer 15 made of $Ta_2O_5$, or the like, are formed in this order on the layer 14. Therefore, by supplying a current to the heating resistor layer 13 and the power feeding conductor layer 14, a heating portion 17 covered with only the heating resistor layer 13 produces heat so that thermal recording is performed on a recording paper 18 through an ink ribbon, or the like (not shown). In this case, the oxidation-proof layer 15 serves to prevent the heating resistor layer 13 from being oxidized and the abrasion resisting layer 16 serves to protect the thermal head from abrasion by the recording paper 18.

In the thermal head, however, an air gap lies between the heating portion 17 and the recording paper 18 and prevents heat from being transmitted, so that there occurs deterioration in printing quality and reduction in thermal efficiency.

In order to solve the problem, as shown in FIG. 5, a thermal head is proposed, in which a metal layer 19 made of such as Ni, or the like, is provided on a portion corresponding to a heating portion 17 on an oxidation proof layer 15 and covered with an abrasion resisting layer 16. In the thus arranged thermal head, the above-mentioned air gap between the heating portion 17 and the recording paper 18 in FIG. 4 arrangement is obviated and a metal layer 19 of good thermal conduction is disposed in a heating portion 17, so that the thermal conductivity as well as the printing quality are improved. That is, as shown in FIG. 6, thermal heads $A_1$ and $A_2$ each provided with the metal layer 19 may provide higher printing density than thermal heads $B_1$ and $B_2$ in which no metal layer 19 is formed. In the cases of the thermal heads $A_1$ and $B_1$ a driving pulse of 4 ms is used, while in the thermal heads $A_2$ and $B_2$ a driving pulse of 3 ms is used. Further, as shown in FIG. 7, with respect to the temperature distribution of the thermal dots, the temperature distribution of the thermal heads $A_1$, $A_2$ and $A_3$ each provided with the metal layer 19 is equal and flat. In FIG. 7, the thermal dot size is 0.45 mm in the thermal head $A_1$, 0.21 mm in $A_2$ and $B_2$, and 0.13 mm in $A_3$. The thermal head $B_2$ has no metal layer 19. These effects are caused by the fact that the thermal conductivity of the metal layer 19 is higher by two orders than the surrounding.

In such a thermal head having the metal layer 19, however, the metal layer 19 is further covered with the abrasion resisting layer 16, so that there has been a disadvantage that the manufacturing cast increases.

SUMMARY OF THE INVENTION

An object of the present invention is, therefore, to provide such a thermal head having a metal layer as described above, in which an abrasion resisting property is provided in the metal layer to thereby make the metal layer to serve also as an abrasion resisting layer so as to redcce the manufacturing cost of the thermal head.

To attain the above-mentioned object, the thermal head according to the present invention is featured in that an oxidation proof layer and an abrasion resisting layer are formed on a heating resistor layer and an electric conductor layer, and in that the abrasion resisting layer is a metal layer in which abrasion resisting particles are mixed and dispersed and which is partially formed at a portion about a heating portion.

Further, the method of manufacturing a thermal head according to the invention, is featured in that when an oxidation proof layer and an abrasion resisting layer are formed on a heating resistor layer and an electric conductor layer, the abrasion resisting layer is formed by applying non-electrolytic plating at a portion about a heating portion on the oxidation proof layer with a mother metal material into which abrasion resisting particles are mixed and dispersed.

According to the invention, therefore, since an abrasion resisting layer is formed about a heating portion, the heating portion preferably comes in contact with the recording paper, and since the abrasion resisting layer is made of mainly metal having high thermal conductivity, the thermal efficiency as well as the printing quality may be improved. Further, sufficient abrasion resisting capability can be obtained by the abrasion resisting particles mixed and dispersed in the metal material.

DETAILED DESCRIPTION OF PREFERRED EMBODIMENTS

Figure 1:
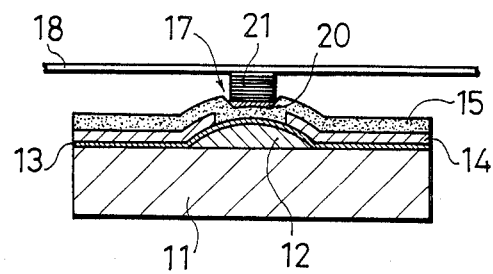
FIG. 1 is a sectional view showing an embodiment of the thermal head according to the present invention.
Figure 2:
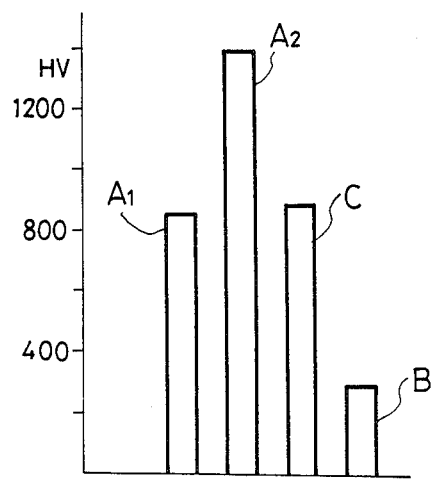
FIG. 2 is a graph showing the hardness in the case where abrasion resisting particles are mixed and dispersed in the material of metal plating.

As shown in FIG. 1, in an embodiment of the thermal head according to the present invention, a glaze layer 12 providing good contact with a recording paper 18, a heating resistor layer 13 made of $Ta_2N$, or the like, a power feeding conductor layer 14 consisting of a motal layer made of Ni-Cr/Au, AL/Ni/AL, or the like, and an oxidation-proof layer 15 made of $SiO_2$, or the like, are piled one on one on an insulating substrate 11 made of alumina, or the like. In this embodiment according to the present invention, a plating forming metal layer 20 made of such as aluminum is previously formed on a portion corresponding to a heating portion 17 on the oxidation-proof layer 15, and an abrasion resisting layer 21 made of a metal material in which abrasion resisting particles are mixed and dispersed is formed on the plating forming metal layer 20.

In manufacturing such a thermal head as described above, the plating forming metal layer 20 is formed on the oxidation proof layer 15 in such a manner that a metal material such as aluminum is deposited on the layer 15 by spattering or evaporating and the deposited layer is formed into a desired pattern by photo-etching. On the thus formed plating metal layer 20, the abrasion resisting layer 21 is formed by applying non-electrolytic plating with a mother metal material into which abrasion resistance particles are mixed and dispersed.

As the metal material for non-electrolytic plating, for example, nickel, or the like, may be used. Specifically, "COMPOSITE SUMER" (trade name: produced by KANIZEN Co., Ltd.).

As the abrasion resisting particles, various kinds of carbide, nitride, oxide, boride, or the like, are used, and more specifically it is preferable to use at least one selected among SiC, BN, $Al_2O_3$, and $CaF_2$.

The abrasion resisting layer 21 may be formed in such a manner that the above-mentioned abrasion resisting particles are mixed into a non-electrolytic plating liquid with a suitable volume ratio and dispersed uniformly in the liquid by using air stirring, and the thus prepared mixture is deposited to form plating on the metal layer 20. Thus, the abrasion resisting particles are dispersed in the deposition film of plating.

As a specific example of the non-electrolytic plating, steps are shown in Table 1 in the case where plating is performed by using a non-electrolytic Ni plating liquid while dispersing SiC in the plating liquid.

TABLE 1

| STEPS | USED CHEMICALS (DENSITY) | CONDITIONS |
| --- | --- | --- |
| Fresh Reduction With Alkali | OP-144  10 g/l | 60 C. 1 min |
| Cleaning with Water | | |
| Cleaning with Acid | $H_2SO_4$  10 v/v % | 60 C. 1 min |
| Cleaning with Water | | |
| Zn Substitution I | K-102  Original Liquid | 20 C. 30 sec |
| Cleaning with Water | | |
| Cleaning with Acid | $HNO_3$  50 V/v % | 20 C. 5 sec |
| Cleaning with Water | | |
| Zn Substitution II | K-102  Original Liquid | 20 C. 30 sec |
| Cleaning with Water | | |
| Ni Plating | S-754 | 90 C. 10 min (2.5 m) |
| Cleaning with Water | | |

Thus, the abrasion resisting property can be extremely improved if the plating layer is formed by mixing and dispersing abrasion resisting particles into a metal material in such a manner as described above. By way of example, the result of a cross cylinder abrasion test is shown in Table 2. From the Table 2, it will be understood that the mixture/dispersion with SiC, $Al_2O_3$, $CaF_2$ may remarkably reduce abrasion in quantity.

TABLE 2

| Fixed Cylinder | Rotary Cylinder | Abrasion Amount (mg/1000 cycle) At Rotary side | Abrasion Amount (mg/1000 cycle) At Fixed Side | Abrasion Total (mg) |
| --- | --- | --- | --- | --- |
| — | — | 282.40 | 120.00 | 402.40 |
| — | HCr | 0.40 | 4.50 | 4.90 |
| — | Ni—P | 1.40 | 3.00 | 4.40 |
| — | SiC | 0.12 | 0.31 | 0.48 |
| — | $Al_2O_3$ | 0.41 | 2.85 | 3.26 |
| — | $Al_2O_3$ + $CaF_2$ | 0.54 | 1.19 | 1.73 |
| — | $CaF_2$ | 0.61 | 0.72 | 1.33 |
| — | SiC + $CaF_2$ | 0.36 | 1.66 | 2.02 |
| — | PTFE | 19.75 | 1.45 | 21.20 |
| HCr | HCr | 5.80 | 0.92 | 6.72 |
| Ni—P | Ni—P | 0.64 | 0.10 | 0.74 |
| SiC | SiC | 0.08 | 0.02 | 0.10 |
| $Al_2O_3$ | $Al_2O_3$ | 0.11 | 0.03 | 0.14 |
| $CaF_2$ | $CaF_2$ | 0.00 | 0.08 | 0.08 |
| PTFE | PTFE | 30.60 | 2.90 | 33.50 |

(Note: Load 6.28 Kg)

The hardness and abrasion resistance of the thus formed abrasion resisting layer 21 can be increased by heat treating the layer 21. That is, as shown in the Table 2, the nickel plating A1 formed by non-electrolytic plating with SiC mixed and dispersed thereinto a hardness which is higher than that of the electric nickel plating B and which is substantially equal to that of the hard chrome plating C, while the nickel plating A2 which has been additionally heat treated shows a further higher hardness than the hard chrome plating C.

Figure 3:
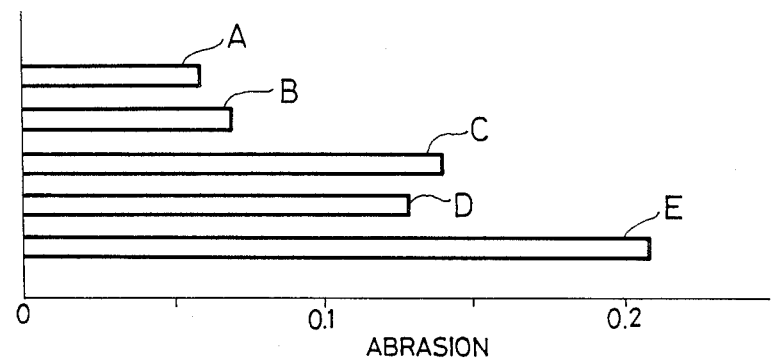
FIG. 3 is a graph showing a dynamic abrasion coefficient in the case where abrasion resisting particles are mixed and dispersed in the material of metal plating.
Figure 4:
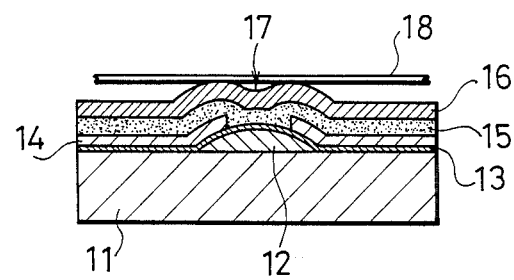
FIG. 4 is a sectional view showing an example of the conventional thermal head.
Figure 5:
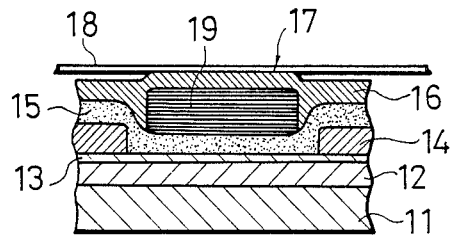
FIG. 5 is a sectional view showing another example of the conventional thermal head.
Figure 6:
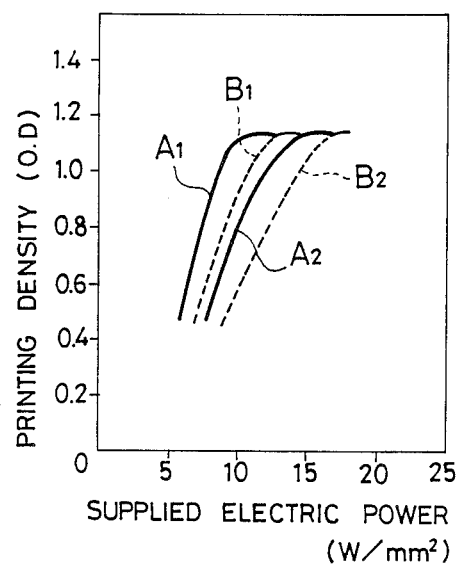
FIG. 6 is a graph showing the relation between supplied electric power and printing density by the thermal head shown in FIG. 5.
Figure 7:
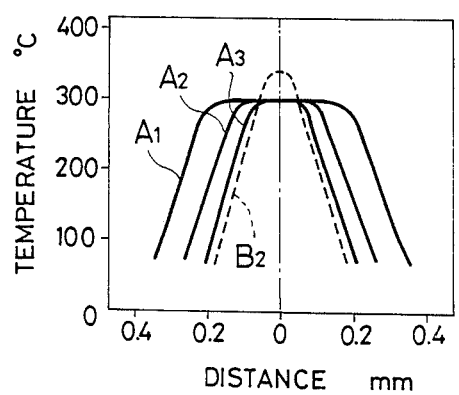
FIG. 7 is a graph showing the temperature distribution at the heating portion in the thermal head shown in FIG. 5.

Besides, the abrasion resisting layer 21 formed in such a manner as described above has a small dynamic abrasion coefficient. That is, in FIG. 3, A indicates the dynamic abrasion coefficient between nickel plating layers each formed by non-electrolytic plating with SiC mixed and dispersed thereinto; B indicates that between the above-mentioned nickel plating layer and a hard chrome plating layer; C indicates that between a nickel plating layer and a steel layer; D indicates that between a hard chrome layer and a steel layer; and E indicates that between steel layers. Thus, the nickel plating formed with SiC mixed and dispersed thereinto shows an extremely low dynamic abrasion coefficient with respect to various kinds of materials. This means that the nickel plating formed with SiC mixed and dispersed thereinto has a superior property for the abrasion resisting layer 21 of a thermal head.

By the way, the thickness of the abrasion resisting lyer 21 is preferably selected to be 3–5 μm.

As described above, according to the present invention, an abrasion resisting layer is formed by providing non-electrolytic plating at a portion about a heating portion on an oxidation proof layer with a mother metal material into which abrasion resisting particles mixed and dispersed, resulting in better contact between the heating portion and a recording paper and in increase in heat conductivity at the heating portion so that the printing quality as well as printing density relative to applied electric power can be improved. Further, since the abrasion resisting particles are mixed and dispersed into in the metal material, sufficient abrasion resistance can be be obtained. Comparing with the conventional thermal head having a metal layer, the thermal head according to the present invention can be manufactured with relatively low cost because a metal layer is made to serve also as an abrasion resisting layer.

What is claimed is:

1. A thermal head comprising a heating resistor layer, a conductor layer, an oxidation proof layer, and an abrasion resisting layer, said oxidation proof layer and said abrasion resisting layer being formed on said heating resistor layer and said conductor layer, in which said abrasion resisting layer is a layer of non-electrolytic nickel plating mother material with abrasion resisting particles mixed and dispersed thereinto, and is applied to a metal layer formed on a central heating portion of said oxidation proof layer.

2. A thermal head according to claim 1, in which said abrasion resisting particles are of at least one kind selected among SiO, BN and $Al_2O_3$.

* * * * *